United States Patent
Lee

(10) Patent No.: US 7,112,848 B2
(45) Date of Patent: Sep. 26, 2006

(54) THIN CHANNEL MOSFET WITH SOURCE/DRAIN STRESSORS

(75) Inventor: Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 10/939,923

(22) Filed: Sep. 13, 2004

(65) Prior Publication Data
US 2006/0054968 A1 Mar. 16, 2006

(51) Int. Cl.
*H01L 27/01* (2006.01)
*H01L 27/12* (2006.01)
*H01L 31/0392* (2006.01)

(52) U.S. Cl. .............................. 257/347; 257/E27.112

(58) Field of Classification Search ................ 257/288, 257/301, 302, 285, 355, 327, 347, 349, 353, 257/354, 66, 192; 438/164, 412; 349/42, 349/43
See application file for complete search history.

(56) References Cited

U.S. PATENT DOCUMENTS 5,686,744 A 11/1997 Kovacic
6,329,690 B1 * 12/2001 Morrett et al. .............. 257/350
6,492,216 B1 12/2002 Yeo et al.
6,707,106 B1 3/2004 Wristers et al.
6,818,938 B1 * 11/2004 Naem ......................... 257/302
2002/0182423 A1 12/2002 Chu et al.
2004/0007715 A1 1/2004 Webb et al.

OTHER PUBLICATIONS

Yee-Chia Yeo, et al., "Design and Fabrication of 50-nm Thin-Body p-MOSFETs With a SiGe Heterostructure Channel", Feb. 2002, pp. 279-286, vol. 49, No. 2, IEEE Transactions on Electron Devices, 0018-9383/02.

* cited by examiner

*Primary Examiner*—B. William Baumeister
*Assistant Examiner*—Dana Farahani
(74) *Attorney, Agent, or Firm*—Haynes and Boone, LLP

(57) ABSTRACT

Methods of manufacturing microelectronic device including, in one embodiment, forming a gate electrode over a substrate having an insulating layer interposing a bulk semiconductor portion and a thin semiconductor layer, and removing at least a portion of the thin semiconductor and insulating layers, thereby defining a pedestal comprising a portion of the thin semiconductor and insulating layers. Source/drain stressors are then formed contacting the source/drain extensions on opposing sides of the pedestal and substantially spanning a height no less than the pedestal.

17 Claims, 2 Drawing Sheets

THIN CHANNEL MOSFET WITH SOURCE/DRAIN STRESSORS

BACKGROUND

As scaling of metal-oxide-semiconductor field-effect-transistors (MOSFETs) continues, the doping concentration, gate oxide thickness, and source/drain (S/D) doping profiles that are required to control short-channel effects become increasingly difficult to meet. The heavy channel doping often required to provide adequate suppression of short-channel effects results in degraded mobility and enhanced junction leakage. In addition, the reduction of gate dielectric thickness for reduced short-channel effects and improved drive current leads to increased direct tunneling gate leakage current and standby power consumption.

One approach to controlling short-channel effects calls for employing a thin silicon film as the MOSFET channel, thereby diminishing or possibly eliminating sub-surface leakage paths. Such a concept is embodied in the thin-body MOSFET, in which the source-to-drain current is restricted to flow in a region near the gate. By not relying on a heavily-doped channel for the suppression of short-channel effects, mobility degradation due to impurity scattering may be reduced, as well as the threshold voltage fluctuation conventionally attributable to the random variation of the number of dopant atoms in the channel region.

However, quality control of the crystalline nature of such thin channels and manufacture of such devices have proven to be challenging. Moreover, the high impedance resulting from thin S/D regions often limits the device performance as device scaling continues.

S/D stressors having a SiGe composition have also been demonstrated as a possible approach not only to controlling short-channel effects due to retarded boron diffusion in SiGe but also improving hole mobility due to compressive strain in the channel. However, arsenic and phosphorus diffusion is enhanced in SiGe and compressive strain can significantly degrade electron mobility. Therefore, such an approach can only offer enhancements to p-MOSFET performance, while employing germanium in n-MOSFET S/D regions can actually exacerbate short-channel effects and diminish device performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
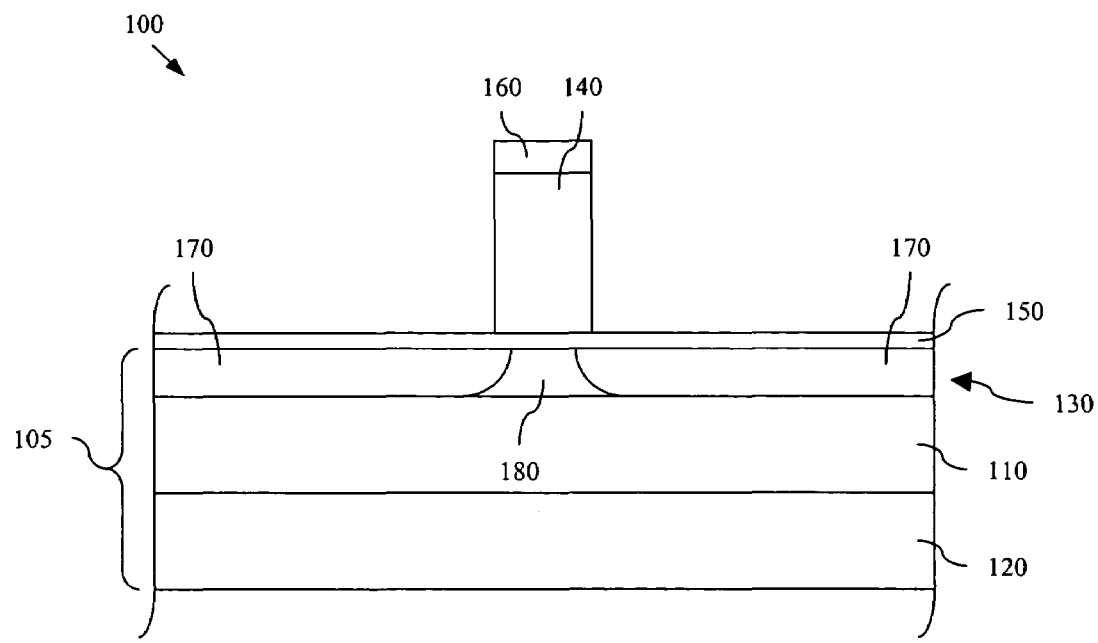
FIG. 1 is a sectional view of at least a portion of one embodiment of a microelectronic device in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of at least a portion of one embodiment of a microelectronic device 100 in an intermediate stage of manufacture according to aspects of the present disclosure. In one embodiment, the device 100 may be fabricated from/on a substrate 105 having an insulating layer 110 interposing a bulk semiconductor portion 120 and a thin semiconductor layer 130.

The substrate 105 and/or the bulk semiconductor portion 120 may comprise silicon, strained silicon, silicon germanium, and/or other materials. The substrate 105 may also be or comprise a silicon-on-insulator (SOI) substrate, such as a silicon-on-sapphire substrate, a silicon germanium-on-insulator substrate, or another substrate comprising an epitaxial semiconductor layer on an insulator layer. For example, in embodiments in which the substrate 105 is an SOI substrate, the thin semiconductor layer 130 may be the epitaxial semiconductor layer, and the insulating layer 110 may be the insulator layer interposing the epitaxial semiconductor layer and the bulk portion of the SOI substrate.

The insulating layer 110 may comprise a dielectric material such as silicon dioxide, tetraethylorthosilicate (TEOS), silicon nitride, and/or other low-k dielectric or electrically insulating materials. The insulating layer 110 may also comprise more than one layer, and may be formed by chemical-vapor deposition (CVD), plasma enhanced CVD (PECVD), atomic layer deposition (ALD), and/or other processes. In one embodiment, the insulating layer 110 may be or comprise a buried oxide layer formed by implanting oxygen or other dielectric materials into the substrate 105.

The thin semiconductor layer 130 may comprise amorphous and/or crystalline silicon, strained silicon, silicon germanium, and/or other materials. The thin semiconductor layer 130 may be formed by epitaxial growth, ALD, CVD, and/or other processes. It is intended that the description herein of the thin semiconductor layer 130 as "thin" indicates that the thin semiconductor layer 130 may have a thickness of about 1800 angstroms or less. That is, a "thin" channel will be defined from the thin semiconductor layer 130 during subsequent processing, and such "thin" channels may have a thickness of about 1800 angstroms or less. For example, the thin semiconductor layer 130 employed in one embodiment within the scope of the present disclosure may have a thickness of about 200 angstroms, and in another embodiment within the scope of the present disclosure may have a thickness ranging between about 10 angstroms and about 500 angstroms. However, aspects of the present disclosure are applicable or readily adaptable to devices employing channels having other thicknesses, including those greater than about 1800 angstroms. Accordingly, the thickness of the thin semiconductor layer 130 is not necessarily less than about 1800 angstroms in every embodiment constructed according to aspects of the present disclosure. In some embodiments, the thin nature of the subsequently formed channel may reduce short-channel effects in the resulting device.

The device 100 also includes a gate electrode 140 and a gate dielectric layer 150 interposing the gate electrode 140 and the thin semiconductor layer 130. The gate electrode 140 may comprise doped or undoped polysilicon and/or other conductive or semiconductive materials, and may be formed by CVD, PECVD, ALD, and/or other processing techniques. The gate electrode 140 may be selectively deposited, or may be formed by blanket deposition followed by wet etching, dry etching, or other patterning processes (hereafter collectively referred to as patterning processes). The gate dielectric layer 150 may comprise silicon dioxide, silicon nitride, silicon oxy-nitride, high- or low-k dielectric materials, and/or other materials, and may be formed by epitaxial growth, deposition, and/or other processes. One or both of the gate electrode 140 and the gate dielectric layer 150 may also comprise more than one layer.

Manufacture of the device 100 may also employ a sacrificial or other type of mask 160. The mask 160 may be a hard mask, and may comprise silicon nitride, silicon oxy-nitride, silicon carbide, and/or other materials. The mask 160 may be formed by CVD, physical vapor deposition (PVD), and or other processes, and may have a width that is substantially similar to the width of the gate electrode 140.

After the gate electrode 140 is formed, source/drain extensions 170 may be formed in the thin semiconductor layer 130. The source/drain extensions 170 maybe formed by ion implantation. For example, the source/drain extensions 170 may comprise p-type and/or n-type impurities, such as phosphorus, arsenic, boron, and/or other materials. Subsequent diffusion, annealing, and/or electrical activation processes may also be employed after implantation, possibly to obtain a doping profile extending from outside a projected perimeter of the gate electrode 140 to within the projected perimeter of the gate electrode 140. Consequently, a thin channel region 180 may be defined in the thin semiconductor layer 130 between the source/drain extensions 170. In one embodiment, the source/drain extensions 170 may be formed employing a dose ranging between about $1 \times 10^{13}$ $cm^{-2}$ and about $5 \times 10^{15}$ $cm^{-2}$.

Figure 2:
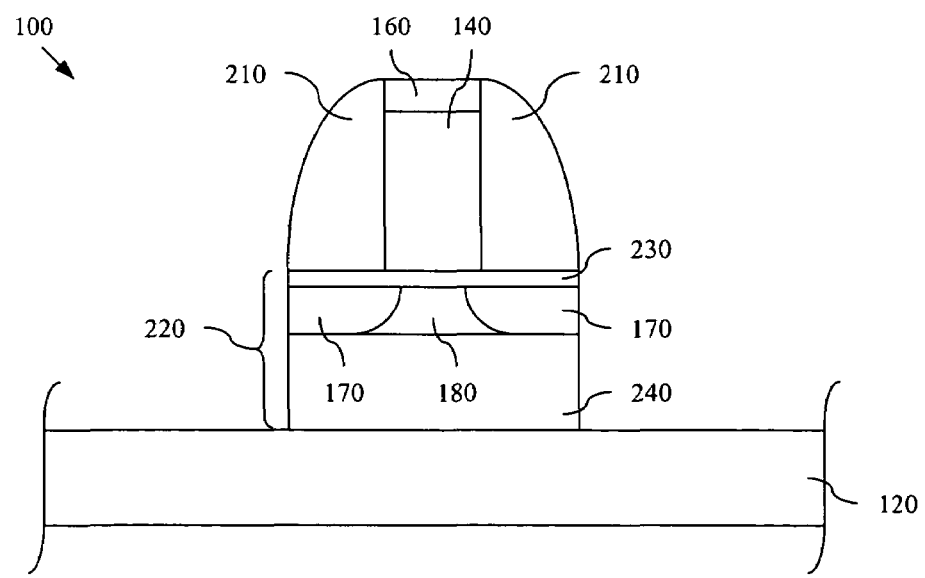
FIG. 2 is a sectional view of the device shown in FIG. 1 in a subsequent stage of manufacture.

Referring to FIG. 2, illustrated is a sectional view of the device 100 shown in FIG. 1 in a subsequent stage of manufacture according to aspects of the present disclosure. The device 100 may also include spacers 210 formed over the gate dielectric layer 150 and on opposing sides of the gate electrode 140. In one embodiment, the spacers 210 may be a single spacer extending substantially around the perimeter of the gate electrode 140. Hereafter, reference to multiple spacers 210 includes embodiments in which one or more of such a wrap-around spacer is employed. The spacers 210 may comprise one or more layers of silicon nitride, silicon oxide, and/or other materials, and may be formed by CVD, spin-on coating, and/or other processes. Fabrication of the spacers 210 may also comprise chemical mechanical polishing, chemical mechanical planarizing (hereafter collectively referred to as CMP), and/or anisotropic etching.

The spacers 210 may independently or collectively be employed as a mask or pattern during subsequent processing to remove at least portions of the gate dielectric layer 150, the thin semiconductor layer 130 (and, thus, the source/drain extensions 170), and/or the insulating layer 110. Such a mask may also include the mask 160, when employed, during material removal. The removal of portions of the gate dielectric layer 150, the semiconductor layer 130 and/or the insulating layer 110 may employ chemical etching, plasma etching, focused ion beam (FIB) processing, and/or other processes. Such processing may be employed to remove material to a depth extending to or partially into the bulk semiconductor portion 120. However, in one embodiment, a portion of the insulating layer 110 may remain on the bulk semiconductor portion 120.

The removal of portions of the gate dielectric layer 150, the semiconductor layer 130 and/or the insulating layer 110 may form a pedestal 220 extending substantially between the gate electrode 140 and the bulk semiconductor portion 120. Thus, the pedestal 220 may comprise: (1) a gate dielectric 230 defined from the gate dielectric layer 150, (2) the channel region 180 and patterned portions of the source/drain extensions 170 defined from the thin semiconductor layer 130, and (3) an insulating member 240 defined from the insulating layer 110. Each of these three segments of the pedestal, as well as any other components that may be included in the pedestal 220, may have a width about equal to a width spanning the outer edges of the spacers 210. Similarly, the collective width of the source/drain extensions 170 and the channel region 180 may substantially span the distance between the outer edges of the spacers. In one embodiment, the width of the pedestal is about three times the width of the gate electrode 140.

After the formation of the pedestal 220, the mask 160 may be removed, such as by wet etching, dry etching, and/or other processes. The spacers 210 may also be removed, possibly simultaneously with the removal of the mask 160. In such embodiments, additional spacers may be formed to substantially replace the spacers 210. However, the removal of the mask 160 may leave the spacers 210 substantially intact, although possibly altering their shape. For example, CMP may be employed to remove the mask 160, such that remaining portions of the spacers 210 may be substantially coplanar with the gate electrode 140.

Figure 3:
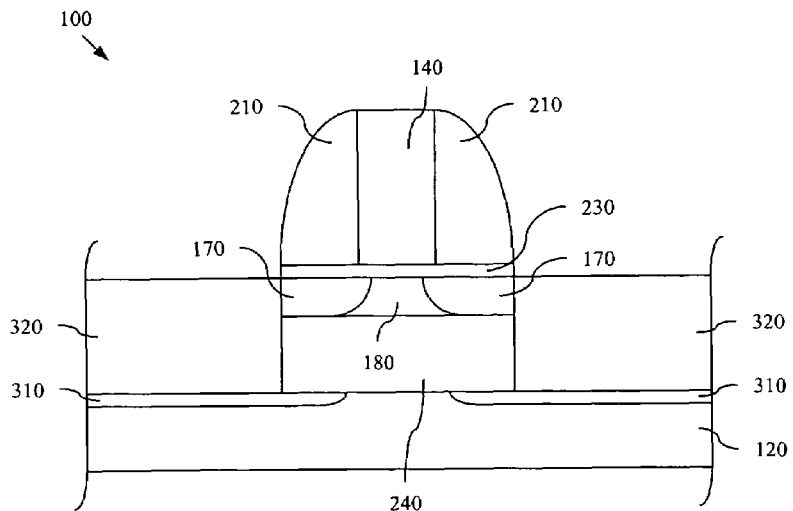
FIG. 3 is a sectional view of the device shown in FIG. 2 in a subsequent stage of manufacture.

Referring to FIG. 3, illustrated is a sectional view of the device 100 shown in FIG. 2 in a subsequent stage of manufacture according to aspects of the present disclosure. Doped regions 310 may be formed in the bulk semiconductor portion 120. The doped regions 310 may be formed by implanting p-type and/or n-type impurity ions into the bulk semiconductor portion 120. Impurities employed to form the doped regions 310 may include phosphorus, arsenic, boron, and/or other materials. In one embodiment, the implanted impurities comprise carbon and/or germanium. Subsequent diffusion, annealing, and/or electrical activation processes may also be employed to form the doped regions 310, possibly extending the doped regions 310 from within a projected perimeter of the insulating member 240 to within the projected perimeter of the insulating member 240.

The device 100 may also include source/drain stressors 320 formed prior to the formation of the doped regions 310 and on opposing sides of the insulating member 240 such that each of the source/drain stressors 320 contacts a corresponding one of the source/drain extensions 170. The source/drain stressors 320 may comprise one or more layers of a semiconductor material, such as silicon, silicon germanium, silicon carbide, and/or other semiconductor materials. In one embodiment, the source/drain stressors 320 comprise one or more dielectric materials, such as silicon dioxide. The source/drain stressors 320 may also comprise one or more other materials, including conductive materials. The source/drain stressors 320 may be formed by epitaxial growth, CVD, PECVD, ALD, and/or other processes. In one embodiment, the source/drain stressors 320 may be doped in-situ (i.e., during their formation) with an n-type or p-type impurity. The source/drain stressors 320 may also be doped with carbon or other impurities. The thickness of one or both of the source/drain stressors 320 may be greater than the thickness of the channel region 180. For example, one or both of the source/drain stressors 320 may be about twice as thick as the channel region 180. Source/drain stressors 320 that are thicker than the channel region 180 may contribute to achieving reliable and low-resistivity silicided contact to the source/drain extensions 170 and/or the doped regions 310.

In some embodiments, the incorporation of an impurity in the source/drain stressors 320 may alter their mechanical and/or electrical characteristics and/or crystalline structure or stress. For example, fabrication according to some aspects of the present disclosure may establish a tensile or compressive stress within the source/drain stressors 320. Such stress may influence the crystalline structure and/or stress of the channel region 180. In addition, stress established in the source/drain stressors 320 may enlarge or reduce the crystalline structure of the channel region 180, which may thereby increase any compressive or tensile stress, respectively, within the channel region 180. The stress established in one or both of the source/drain stressors 320 and/or the channel region 180 may be tensile or compressive stress ranging between about 0.001 Pa and about 50 Gpa in some embodiments. In one embodiment, the tensile or compressive stress in the channel region 180 is about 200 Pa. In some embodiments, the stress established in the channel region 180 may increase mobility within the channel region 180.

In some embodiments, the source/drain stressors 320 may not have substantially similar geometric shapes or compositions. For example, the thicknesses of the source/drain stressors 320 relative to the bulk semiconductor portion 120 may differ, or the widths of the source/drain stressors 320 relative to the gate electrode 140 may differ. In one embodiment, one or both of the source/drain stressors 320 may extend beyond the gate dielectric 230 in a direction away from the bulk semiconductor portion 120.

Figure 4:
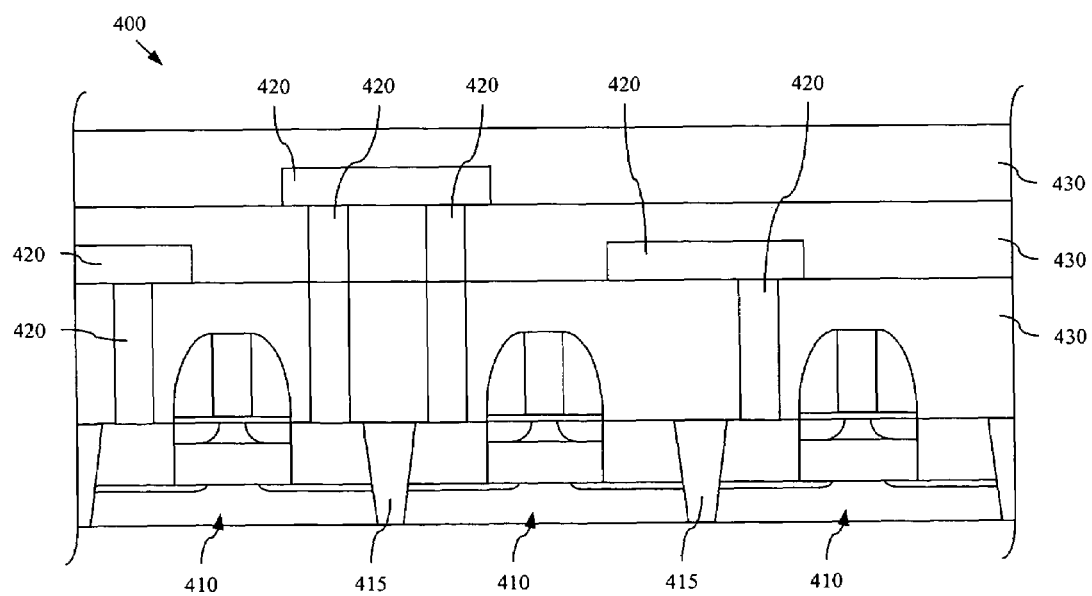
FIG. 4 is a sectional view of at least a portion of one embodiment of an integrated circuit device according to aspects of the present disclosure.

Referring to FIG. 4, illustrated is a sectional view of at least a portion of one embodiment of an integrated circuit device 400 according to aspects of the present disclosure. The integrated circuit device 400 is one environment in which the device 100 described above may be implemented. For example, the device 400 includes a plurality of microelectronic devices 410, one or more of which may be substantially similar to the device 100 shown in FIG. 3. However, the microelectronic devices 410 may also comprise one or more devices other than those that are substantially similar to the device 100 shown in FIG. 3. The device 400 may also comprise one or more isolation structures 415 interposing ones of the microelectronic devices 410. For example, the isolation structures 415 may comprise shallow trench isolation features and/or local oxidation of silicon (LOCOS) features.

The integrated circuit device 400 also includes interconnects 420 extending along and/or through one or more dielectric layers 430 to ones of the devices 410. The interconnects 420 may comprise copper, tungsten, gold, aluminum, and/or other materials, and may be formed by CVD, PECVD, ALD, PVD, and/or other processes. The dielectric layers 430 may comprise silicon dioxide, BLACK DIAMOND (a product of Applied Materials of Santa Clara, Calif.), and/or other materials, and may be formed by CVD, PECVD, ALD, PVD, spin-on coating, and/or other processes.

Thus, the present disclosure provides a method of manufacturing a microelectronic device including, in one embodiment, forming a gate electrode over a substrate having an insulating layer interposing a bulk semiconductor portion and a thin semiconductor layer. Source/drain extensions are formed in the thin semiconductor layer and extending from outside a projected perimeter of the gate electrode to within the projected gate electrode perimeter, thereby defining a channel region within the projected gate electrode perimeter. At least portions of the thin semiconductor and insulating layers are removed, thereby defining a pedestal comprising a portion of the thin semiconductor and insulating layers. Source/drain stressors are formed contacting the source/drain extensions on opposing sides of the pedestal and substantially spanning a height of the pedestal.

Another embodiment of a method of manufacturing a microelectronic device according to aspects of the present disclosure includes providing a substrate having an insulating layer interposing a bulk semiconductor portion and a thin semiconductor layer, forming a gate dielectric layer over the thin semiconductor layer, and forming a gate electrode over the gate dielectric layer. Source/drain extensions are formed in the thin semiconductor layer and extending to within a projected perimeter of the gate electrode, thereby defining a channel region in the thin semiconductor layer and confined within the projected perimeter of the gate electrode. Spacers are formed on opposing sides of the gate electrode, and portions of the gate dielectric layer, the thin semiconductor layer, and the insulating layer are removed, thereby exposing portions of the bulk semiconductor portion. Source/drain stressors are formed over the bulk semiconductor portion, wherein each of the source/drain stressors contacts a corresponding one of the source/drain extensions.

Another embodiment of a method of manufacturing a microelectronic device according to aspects of the present disclosure includes forming a gate electrode over a substrate having an insulating layer interposing a bulk semiconductor portion and a thin semiconductor layer, and removing at least a portion of the thin semiconductor and insulating layers, thereby defining a pedestal comprising a portion of the thin semiconductor and insulating layers. Source/drain stressors are then formed contacting the source/drain extensions on opposing sides of the pedestal and substantially spanning a height of the pedestal.

The present disclosure also introduces a microelectronic device including, in one embodiment, a silicon-on-insulator substrate having an insulating layer interposing a bulk semiconductor portion and a thin semiconductor layer. The device also includes a pedestal having a first width defined from the thin semiconductor and insulating layers over the bulk semiconductor portion, wherein the portion of the pedestal defined from the thin semiconductor layer comprises a channel region interposing source/drain extensions. The device also includes a gate electrode having a second width and located over the pedestal, wherein the second width is substantially less than the first width. Source/drain stressors are located over the bulk semiconductor portion and each contact a corresponding one of the source/drain extensions, wherein at least one of the source/drain stressors is thicker than the channel region, possibly at least about twice as thick as the channel region.

An integrated circuit device is also provided in the present disclosure. In one embodiment, the integrated circuit device includes a plurality of microelectronic devices located at least partially in a substrate having an insulating layer interposing a bulk semiconductor portion and a thin semiconductor layer. In such an embodiment, ones of the plurality of microelectronic devices comprise: (1) a pedestal having a first width defined from the thin semiconductor and insulating layers over the bulk semiconductor portion, wherein the portion of the pedestal defined from the thin semiconductor layer comprises a channel region interposing source/drain extensions; (2) a gate electrode having a second width and located over the pedestal, wherein the second width is substantially less than the first width; and (3) source/drain stressors located over the bulk semiconductor portion and each contacting a corresponding one of the source/drain extensions, wherein at least one of the source/drain stressors is thicker than the channel region, possibly at least about twice as thick as the channel region. Such an integrated circuit device also includes a plurality of interconnects interconnecting ones of the plurality of microelectronic devices.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microelectronic device, comprising:
   a silicon-on-insulator substrate having an insulating layer interposing a bulk semiconductor portion and a thin semiconductor layer;
   a pedestal having a first width defined from the thin semiconductor and insulating layers over the bulk semiconductor portion, wherein the portion of the pedestal defined from the thin semiconductor layer comprises a channel region interposing source/drain extensions;
   a gate electrode having a second width and located over the pedestal, wherein the second width is different than the first width; and
   source/drain stressors located over the bulk semiconductor portion and each contacting a corresponding one of the source/drain extensions, wherein at least one of the source/drain stressors is thicker than the channel region.

2. The device of claim 1 wherein the source/drain stressors comprises a semiconductor material having a different lattice constant from the channel region.

3. The device of claim 1 wherein at least one of the thin semiconductor layer and the source/drain stressors comprises a material selected from the group consisting of:
   silicon;
   silicon germanium;
   silicon carbide; and
   silicon germanium carbide.

4. The device of claim 1 wherein the thin semiconductor layer has a thickness of about 200 angstroms.

5. An integrated circuit device, comprising:
   a plurality of microelectronic devices located at least partially in a substrate having an insulating layer interposing a bulk semiconductor portion and a thin semiconductor layer, wherein ones of the plurality of microelectronic devices comprise:
      a pedestal having a first width defined from the thin semiconductor and insulating layers over the bulk semiconductor portion, wherein the portion of the pedestal defined from the thin semiconductor layer comprises a channel region interposing source/drain extensions;
      a gate electrode having a second width and located over the pedestal, wherein the second width is different from the first width; and
      source/drain stressors located over the bulk semiconductor portion and each contacting a corresponding one of the source/drain extensions, wherein at least one of the source/drain stressors is thicker than the channel region; and
   a plurality of interconnects interconnecting ones of the plurality of microelectronic devices.

6. The device of claim 5 at least one of the thin semiconductor layer and the source/drain stressors comprises a semiconductor material having a different lattice constant than the channel region.

7. The device of claim 5 wherein the thin semiconductor layer comprises a material selected from the group consisting of:
   silicon;
   silicon germanium;
   silicon carbide; and
   silicon germanium carbide.

8. The device of claim 5 wherein the source/drain stressors of ones of the plurality of microelectronic devices comprise a material selected from the group consisting of:
   silicon;
   silicon germanium;
   silicon carbide; and
   silicon germanium carbide.

9. The device of claim 5 wherein the thin semiconductor layer has a thickness of about 200 angstroms.

10. A microelectronic device, comprising:
    a silicon-on-insulator substrate having an insulating layer interposing a bulk semiconductor portion and a thin semiconductor layer;
    a pedestal having a first width defined from the thin semiconductor layer and the insulating layer, wherein the portion of the pedestal defined from the thin semiconductor layer comprises source/drain extensions and a channel region interposing the source/drain extensions;
    a gate electrode having a second width and located over the pedestal, wherein the second width is substantially less than the first width;
    source/drain stressors located over the bulk semiconductor portion, wherein the source/drain stressors each span the insulating layer portion of the pedestal and contact a corresponding one of the source/drain extensions; and
    doped regions formed in the bulk semiconductor portion of the silicon-on-insulator substrate thus separating the remainder of the bulk semiconductor portion from the source/drain stressors;
    wherein the source/drain stressors each have a first lattice structure that is different relative to at least one of a second lattice structure of the source/drain extensions and a third lattice structure of the doped regions formed in the bulk semiconductor portion of the silicon-on-insulator substrate.

11. The device of claim 10 wherein the first lattice structure of the source/drain stressors is different relative to each of the second lattice structure of the source/drain extensions and the third lattice structure of the doped regions formed in the bulk semiconductor portion of the silicon-on-insulator substrate.

12. The device of claim 10 wherein the thin semiconductor layer comprises a first material and the source/drain stressors each comprise a second material that is different from the first material, and wherein each of the first and second materials are selected from the group consisting of:
   silicon;
   silicon germanium;
   silicon carbide; and
   silicon germanium carbide.

13. The device of claim 10 wherein the thin semiconductor layer has a thickness of about 200 angstroms.

14. A microelectronic device, comprising:
   a silicon-on-insulator substrate having an insulating layer interposing a bulk semiconductor portion and a thin semiconductor layer;
   a pedestal defined from the thin semiconductor and insulating layers, wherein the portion of the pedestal defined from the thin semiconductor layer comprises a source extension, a drain extension, and a channel region interposing the source and drain extensions;
   a gate electrode located over the pedestal, wherein the gate electrode is greater in width relative to a substantial portion of the pedestal; and
   a source stressor and a drain stressor located on opposing sides of the pedestal and each contacting a corresponding one of the source and drain extensions, wherein at least one of the source and drain stressors is thicker than the channel region.

15. The device of claim 14 wherein the source and drain stressors each comprise a semiconductor material having a different lattice constant relative to the channel region lattice constant.

16. The device of claim 14 wherein the thin semiconductor layer, the source stressor, and the drain stressor each comprise a material selected from the group consisting of:
   silicon;
   silicon germanium;
   silicon carbide; and
   silicon germanium carbide.

17. The device of claim 14 wherein the thin semiconductor layer has a thickness of about 200 angstroms.

* * * * *